(12) United States Patent
Paul et al.

(10) Patent No.: US 12,742,845 B2
(45) Date of Patent: Sep. 22, 2026

(54) METHOD FOR ASCERTAINING FLIP ANGLES, MAGNETIC RESONANCE APPARATUS, AND COMPUTER PROGRAM PRODUCT

(71) Applicant: Siemens Healthcare GmbH, Erlangen (DE)

(72) Inventors: Dominik Paul, Bubenreuth (DE); Mario Zeller, Erlangen (DE); Flavio Carinci, Würzburg (DE); Max Müller, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 235 days.

(21) Appl. No.: 18/520,185

(22) Filed: Nov. 27, 2023

(65) Prior Publication Data

US 2024/0210508 A1 Jun. 27, 2024

(30) Foreign Application Priority Data

Dec. 22, 2022 (DE) ..................... 10 2022 214 320.5

(51) Int. Cl.
*G01R 33/56* (2006.01)
*G01R 33/561* (2006.01)

(52) U.S. Cl.
CPC ................................ *G01R 33/5618* (2013.01)

(58) Field of Classification Search
CPC .... G01R 33/5618; G01R 33/48; G01R 33/54; G06F 19/20; G06F 19/22
USPC ................................ 324/307, 318, 322, 309
See application file for complete search history.

(56) References Cited

U.S. PATENT DOCUMENTS

2004/0051527 A1* 3/2004 Mugler, III ........ G01R 33/5615 324/309
2005/0240095 A1* 10/2005 Schaffter .............. G01R 33/583 324/309
2008/0278159 A1* 11/2008 Park ................... G01R 33/5617 324/307
2008/0285101 A1* 11/2008 Shiraishi .................. G02B 5/09 359/198.1
2019/0250224 A1* 8/2019 Zeller ................ G01R 33/5602

OTHER PUBLICATIONS

Questions and Answers in MRI:; Titel. Reduced Flip angle FSE. (URL:https://mriquestions.com/reduced-flip-angle-fse.html); [Jun. 6, 2023]; pp. 1-2.
Questions and Answers in MRI:; Specific Absorption Rate: (URL:https ://web.archive.org/web/20210506003754/https://mriq uestions.com/wh at-is-sar.html); [Jul. 6, 2023); pp. 1-2.

* cited by examiner

*Primary Examiner* — Lee E Rodak
*Assistant Examiner* — Taqi R Nasir
(74) *Attorney, Agent, or Firm* — Lempia Summerfield Katz LLC

(57) ABSTRACT

A computer-implemented method for ascertaining flip angles of a magnetic resonance sequence with variable flip angles, a magnetic resonance apparatus, and a computer program product are disclosed. In this case, the magnetic resonance sequence includes at least one echo train with an excitation pulse and a plurality of refocusing pulses. In each case, an adapted flip angle is ascertained for at least one part of the plurality of refocusing pulses.

20 Claims, 3 Drawing Sheets

METHOD FOR ASCERTAINING FLIP ANGLES, MAGNETIC RESONANCE APPARATUS, AND COMPUTER PROGRAM PRODUCT

The present patent document claims the benefit of German Patent Application No. 10 2022 214 320.5, filed Dec. 22, 2022, which is hereby incorporated by reference in its entirety.

TECHNICAL FIELD

The disclosure relates to a computer-implemented method for ascertaining flip angles of a magnetic resonance sequence with variable flip angles, a magnetic resonance apparatus, and a computer program product.

BACKGROUND

In medical technology, imaging by magnetic resonance (MR), also referred to as Magnetic Resonance Imaging (MRI), is characterized by strong soft-tissue contrasts. During a magnetic resonance measurement, radio-frequency (RF) pulses for generating an RF field (also referred to as a B1 field) and gradient pulses for generating a magnetic field gradient according to a magnetic resonance sequence are beamed into an examination area in which a patient is located with the aid of a magnetic resonance apparatus. As a result, spatially encoded echo signals are triggered in the patient, which may also be referred to as magnetic resonance signals. The magnetic resonance signals are received as measurement data from the magnetic resonance apparatus and used to reconstruct magnetic resonance imaging.

Whether the operating parameters of the magnetic resonance sequence are suitable for observing certain boundary conditions may be checked before performing a magnetic resonance measurement. Such boundary conditions may be based on the performance of the magnetic resonance apparatus and/or on patient safety. In certain circumstances, it may be necessary to adapt the magnetic resonance sequence in order to be able to perform the magnetic resonance measurement.

SUMMARY AND DESCRIPTION

The object of the present disclosure may be considered to make an adaptation to a magnetic resonance sequence, in particular in an automated and/or flexible manner.

The scope of the present disclosure is defined solely by the appended claims and is not affected to any degree by the statements within this summary. The present embodiments may obviate one or more of the drawbacks or limitations in the related art.

A computer-implemented method for ascertaining flip angles of a magnetic resonance sequence with variable flip angles is proposed. The magnetic resonance sequence includes at least one echo train with an excitation pulse and a plurality of refocusing pulses. An adapted flip angle for at least one part of the plurality of refocusing pulses is determined in each case.

A magnetic resonance sequence may include a plurality of sequence modules, such as RF pulses and gradient pulses, for example. A flip angle may be an angle, e.g., related to a direction of a main magnetic field of a magnetic resonance apparatus, with which the magnetic resonance sequence is to be carried out, into which net magnetization is rotated through the application of an RF pulse. Flip angles of RF pulses of a magnetic resonance sequence may be variable, if they are changeable and/or not constant, in particular are not the same for all RF pulses of the magnetic resonance sequence. In particular, the flip angles of the magnetic resonance sequence describe a flip angle curve that, in particular, is variable.

An echo train may include a part of the sequence modules of the magnetic resonance sequence. An echo train may be considered as part of an MR recording method with a plurality of MR echoes with a spin echo contrast. An echo train may include a series of refocusing pulses and their corresponding MR echoes. The magnetic resonance sequence may be a multi-echo sequence, for example, a fast spin echo or turbo spin echo pulse sequence. In particular, one shift may be wholly or partially recorded per echo train.

A plurality of refocusing pulses may follow the excitation pulse. A refocusing pulse may cause a reversal of dephasing, i.e., the spins are phased again.

At least for one part of the refocusing pulses of the plurality of refocusing pulses, the flip angle is adapted in each case, e.g., only one of the plurality of refocusing pulses may be adapted to the flip angle, or the flip angles of a partial quantity of the refocusing pulses may be adapted, or the flip angles of all the refocusing pulses may be adapted.

The adaptation of the flip angle may include a reduction in the flip angle. Advantageously, the flip angles of the refocusing pulses of the at least one part of the plurality of refocusing pulses are adapted in such a way that at least one specified boundary condition is met.

The at least one boundary condition may be a performance-limiting boundary condition or include a performance-limiting boundary condition. Such a boundary condition may describe a performance limit, (e.g., a maximum performance), of a radio-frequency amplifier of the magnetic resonance apparatus. Such a boundary condition may describe an electrical recharging capability and/or a maximum electrical charging capacity and/or a limitation for avoiding overheating of a radio-frequency amplifier of the magnetic resonance apparatus. The more generously dimensioned a radio-frequency amplifier is, the less quickly the radio-frequency amplifier may reach its performance limits.

The recharging capability may be described by a rate at which electrical recharging of the radio-frequency amplifier takes place. This may be expressed in the unit coulomb/second. The maximum electrical charging capability may be described by the maximum electrical charge which may be (e.g., temporarily) stored and reduced for sending transmission pulses. This may be expressed in the unit coulomb.

The at least one boundary condition may describe a maximum specific absorption rate of the patient. A specific absorption rate may be patient-specific by being dependent on a mass of the patient.

The specific absorption rate may be the radio-frequency energy absorbed per unit of time and per kilogram of body weight after RF irradiation. Absorption of RF energy may result in heating of the body tissue of the patient. In the case of an inadmissibly high local concentration of RF energy, RF burns may occur (local SAR). With an even distribution of RF energy over the entire body, the load on the thermoregulation or cardiovascular system of the patient is significant (whole body SAR). The at least one boundary condition may include a short-term SAR limit, e.g., a is SAR limit.

Advantageously, an adaptation, (e.g., a reduction), of the refocusing pulses leads to a lower load on the radio-frequency amplifier and/or SAR load on the patient.

Ascertaining the respective adapted flip angle for at least one part of the plurality of refocusing pulses may be carried out by a control unit, (e.g., a system control unit), of a magnetic resonance apparatus. The control unit may include a computing unit, in particular one or more processors, and/or a memory unit, in particular one or more memory modules.

According to a magnetic resonance sequence, a magnetic resonance measurement, (e.g., of a patient), may be carried out with the adapted flip angles of the refocusing pulses. Magnetic resonance signals may be recorded in the process. At least one magnetic resonance image may be reconstructed based on the recorded magnetic resonance signals.

Ascertaining the respective adapted flip angle may include providing a respective initial flip angle, $a_{3 \ldots n}$, for each refocusing pulse of the at least one part of the plurality of refocusing pulses, providing a magnitude integral of the excitation pulse, $M_1$, and providing a respective magnitude integral of the plurality of refocusing pulses, $M_{2 \ldots n}$. The respective adapted flip angle, $a'_{3 \ldots n}$, for at least one part of the plurality of refocusing pulses is ascertained based on the magnitude integral of the excitation pulse, $M_1$, the respective magnitude integral of the refocusing pulses, $M_{2 \ldots n}$, and the respective initial flip angle, $a_{3 \ldots n}$, for each refocusing pulse of the at least one part of the plurality of refocusing pulses.

Ascertaining the respective adapted flip angle may further include providing an initial reduction factor, c, for reducing the excitation pulse and the plurality of refocusing pulses. The respective adapted flip angle, $a'_{3 \ldots n}$, for at least one part of the plurality of refocusing pulses, is further ascertained on the basis of the initial reduction factor, c.

In particular, the adapted flip angles $a'x=_{3 \ldots n}$ are a function of the magnitude integral of the excitation pulse $M_1$, of the respective magnitude integral of the refocusing pulses, $M_{2 \ldots n}$, of the initial reduction factor, c, and of the respective initial flip angle, $a_{3 \ldots n}$, for each refocusing pulse of the at least one part of the plurality of refocusing pulses, and may also be displayed as follows:

$$a'_{x=3 \ldots n} = f(M_{x=1 \ldots n}, c, a_{x=3 \ldots n})$$

The index "1" relates to the excitation pulse of the echo train. The indices "2" to "n" relate to the subsequent n−1 refocusing pulses of the echo train. The indices "3" to "n" relate to the refocusing pulses whose flip angle is adapted.

A magnitude integral of a pulse, in particular an excitation pulse or a refocusing pulse, may be a temporal integral over the magnitude of the pulse. The magnitude of a pulse may be the amount of the amplitude of the pulse. Consequently, the magnitude integral of a pulse may be a temporal integral over the amount of the amplitude of the pulse. In figurative terms, this may be understood as a measure of the area that is delimited by a graphical representation of the pulse. In particular, no phase-related negative contributions contribute to the magnitude integral.

The magnitude integral of an excitation pulse or a refocusing pulse may be ascertained from the magnetic resonance sequence to be used, which inter alia describes the excitation pulse or refocusing pulse. Thus, the proposed method may also include the provision of a magnetic resonance sequence from which the other data to be provided may be derived.

The magnetic resonance sequence may be provided by a system control unit of the magnetic resonance apparatus. For example, the magnetic resonance sequence may be retrieved from a memory and/or a database and/or adapted and/or entered by an operator of the magnetic resonance apparatus. The magnitude integrals may be determined, for example, by the system control unit, for instance by calculating the area which is enclosed by an RF pulse described by the magnetic resonance sequence.

A reduction factor, in particular the initial reduction factor, may be a factor that, when the factor is applied to an input variable, (e.g., an initial flip angle), determines a reduced output variable, (e.g., an adapted flip angle). For example, the output variable is obtained by multiplying the reduction factor by the input variable.

The initial reduction factor may be determined based on the power required when applying the magnetic resonance sequence compared to the available power of the magnetic resonance apparatus, in particular a radio-frequency amplifier of the magnetic resonance apparatus.

First, the initial reduction factor may relate to all RF pulses, in particular the excitation pulse and the first refocusing pulse. All of the RF pulses should therefore be reduced, that is to say changed, in accordance with the initial reduction factor. However, the excitation pulse should not be changed, in particular in order to perform the magnetic resonance measurement optimally, so that the initial reduction factor is not to be applied to the excitation pulse. By excluding the excitation pulse from the reduction, the reducing effect of the application of the initial reduction factor is reduced. Advantageously, an inadequate overall reduction in the flip angle is compensated by ascertaining the respective adapted flip angle for at least one part of the plurality of refocusing pulses.

Ascertaining the respective adapted flip angle for at least one part of the plurality of refocusing pulses may include determining a global reduction factor that is applied, in particular uniformly, to each refocusing pulse of the at least one part of the plurality of refocusing pulses.

In particular, each of the adapted flip angles of the refocusing pulses of the at least one part of the plurality of refocusing pulses results from a multiplication of the (same) global reduction factor by the respective initial flip angle. In particular, it is a constant and/or non-individual reduction.

The global reduction factor c' may be calculated according to the formula:

$$c' = \frac{c \cdot \sum_{x=1}^{n} M_x - M_1 - M_2}{\sum_{x=3}^{n} M_x}$$

Here, as already described above, c is the initial reduction factor, $M_1$ the magnitude integral of the excitation pulse, and $M_{2 \ldots n}$ the magnitude integrals of the refocusing pulses.

The global reduction factor c' may be multiplied by the respective initial flip angle $a_{3 \ldots n}$ in order to obtain the respective adapted flip angle $a'_{3 \ldots n}$. That is, each flip angle $a_3, a_4, \ldots a_n$ is multiplied by the same global reduction factor c' in order to obtain $a'_3, a'_4, \ldots a'_n$.

Ascertaining the respective adapted flip angle for at least one part of the plurality of refocusing pulses may include ascertaining individual reduction factors for each refocusing pulse of the at least one part of the plurality of refocusing pulses. For example, unlike the application of a global reduction factor, a same reduction factor is not applied to all flip angles, but each flip angle is multiplied by a specific reduction factor.

The ascertaining of the individual reduction factors may take into account a weighting of the magnitude integral of the respective refocusing pulse relative to a mean magnitude integral. The mean magnitude integral may relate to the magnitude integrals of all the refocusing pulses whose flip angle is to be adapted. The mean magnitude integral may be a mean value of the magnitude integrals of all the refocusing pulses whose flip angle is to be adapted.

The individual reduction factor c" may be calculated according to the formula:

$$c''_{3 \ldots n} = c' \frac{M_{3 \ldots n}}{\langle M \rangle}$$

Here, <M> is a mean value of the amplitude integrals $M_{3 \ldots n}$ and may be calculated, for example, according to:

$$\langle M \rangle = \frac{\sum_{x=3}^{n} M_x}{n-2}$$

$M_{3 \ldots n}$/<M> here represents a linear weighting of the magnitude integral. Alternatively, a quadratic weighting of the magnitude integral is also conceivable, for example, according to:

$$c''_{3 \ldots n} = c' \frac{M_{3 \ldots n}^2}{\langle M \rangle^2}$$

Regardless of the type of weighting, the adapted flip angles $a'_{3 \ldots n}$ may be determined, for example, according to:

$$a'_{3 \ldots n} = c'' \cdot a_{3 \ldots n}$$

Here, the individual reduction factor c" is specific to each refocusing pulse as it is weighted with its magnitude integral.

The following may be considered as a boundary condition when adapting the flip angle:

$$c' \cdot \sum_{x=3}^{n} M_x = \sum_{x=3}^{n} (c''_x \cdot M_x)$$

Advantageously, it may be provided that any performance limits, in particular of a radio-frequency amplifier of the magnetic resonance apparatus, are not exceeded.

The method may further include ascertaining a respective adapted flip angle for a refocusing pulse that precedes the at least one part of the plurality of refocusing pulses as a function of a refocusing pulse of the at least one part of the plurality of refocusing pulses.

For example, the refocusing pulse preceding the at least one part of the plurality of refocusing pulses is calculated according to:

$$a'_1 = 90 + \frac{a'_2}{2}$$

Advantageously, the magnetic resonance sequence is a TSE sequence (Turbo Spin Echo), e.g., a HASTE (Half-Fourier Acquisition Single-shot Turbo spin Echo imaging) or a SPACE sequence (Sampling Perfection with Application optimized Contrasts using different flip angle Evolution).

This may be a magnetic resonance sequence with variable flip angles, in which each refocusing pulse is assigned its own flip angle. This may be used for hyperecho, T2var, T1var, and PDvar.

Furthermore, a magnetic resonance apparatus is proposed that is configured to perform a method as described above. The magnetic resonance apparatus may include a computing unit with one or more processors and/or memory modules. The computing unit may be configured as part of a system control unit of the magnetic resonance apparatus.

The advantages of the proposed magnetic resonance apparatus may correspond to the advantages of the proposed method for providing that when a magnetic resonance sequence is used to ascertain flip angles of a magnetic resonance sequence with variable flip angles, explained in detail previously. Features, advantages, or alternative embodiments mentioned here may likewise also be transferred to the other claimed subject-matter and vice versa.

Furthermore, a computer program product is proposed that includes a program and may be loaded directly into a memory of a programmable system control unit of a magnetic resonance apparatus and has program means, for example, libraries and auxiliary functions, to perform a proposed method when the computer program product is executed in the system control unit of the magnetic resonance apparatus. The computer program product may include software with a source code that still needs to be compiled and linked or only needs to be interpreted, or an executable software code that only remains to be loaded into the system control unit for execution.

The proposed method may advantageously be executed quickly, identically, repeatably, and robustly by the computer program product. The computer program product may be configured in such a way that the computer program product may perform the proposed method acts by the system control unit. The system control unit has the prerequisites such as a corresponding main memory, a corresponding graphics card, or a corresponding logic unit, so that the respective method acts may be carried out efficiently.

The computer program product is stored, for example, on a computer-readable medium or on a network or server, from where the computer program product may be loaded into the processor of a local system control unit that may be directly connected to the magnetic resonance apparatus or configured as part of the magnetic resonance apparatus. Moreover, control information of the computer program product may be stored on an electronically readable data carrier. The control information of the electronically readable data carrier may be configured in such a way that the control information carries out a proposed method when the data carrier is used in a system control unit of a magnetic resonance apparatus.

Examples of electronically readable data carriers are a DVD, a magnetic tape, or a USB stick on which electronically readable control information, in particular software, is stored. If this control information is read from the data carrier and stored in a system control unit of the magnetic resonance apparatus, all the proposed embodiments of the methods described above may be executed.

Further advantages, features, and details of the disclosure emerge from the embodiments described hereinafter and with reference to the drawings. Parts corresponding to one another are provided with the same reference characters in all the figures.

BRIEF DESCRIPTION OF THE DRAWINGS

FIG. 2 depicts a diagram of an example of a method for ascertaining flip angles of a magnetic resonance sequence with variable flip angles.

DETAILED DESCRIPTION

Figure 1:
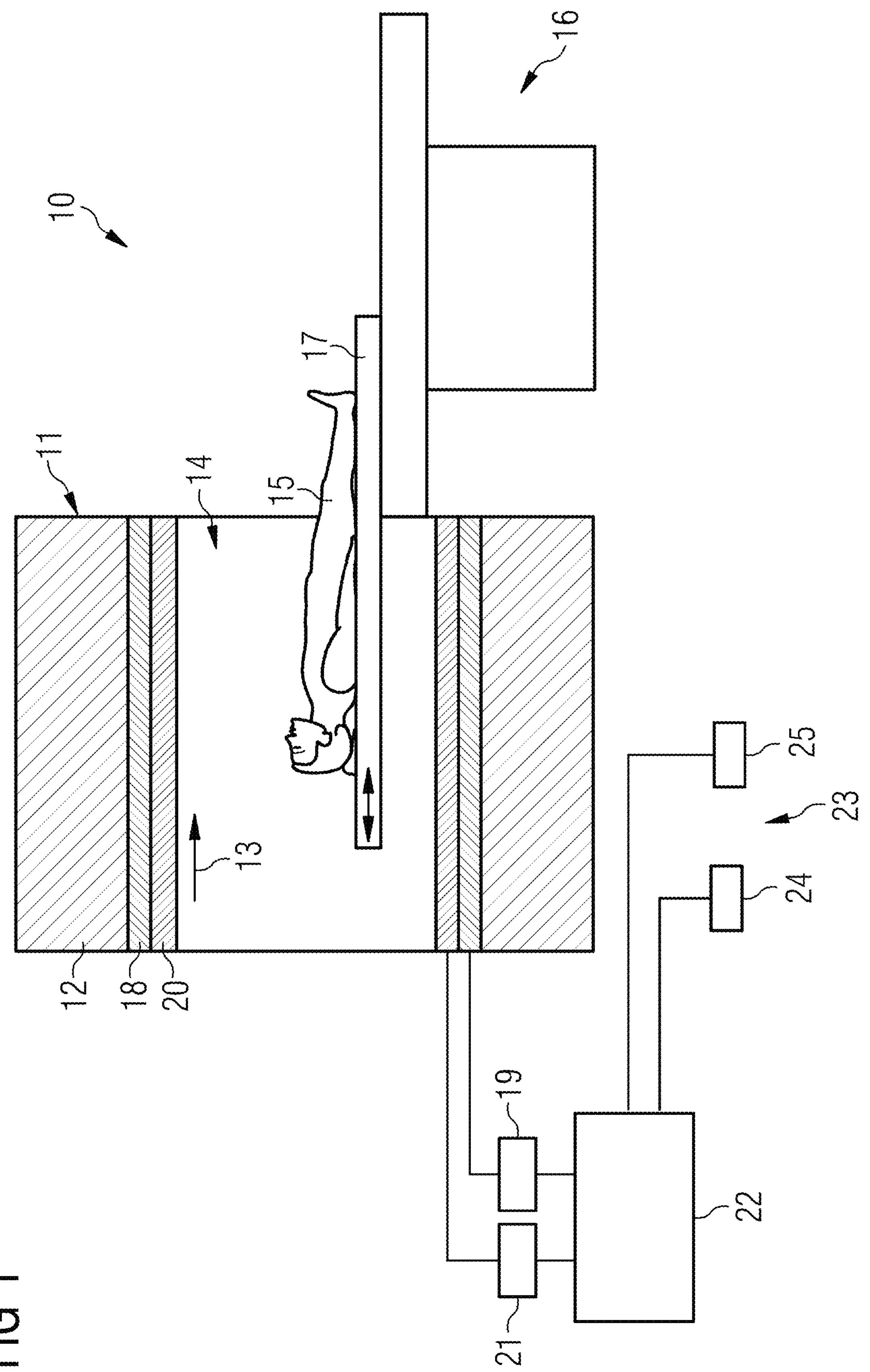
FIG. 1 depicts a diagrammatic view of an example of a magnetic resonance apparatus.

FIG. 1 is a diagrammatic view of a magnetic resonance apparatus 10. The magnetic resonance apparatus 10 includes a magnet unit 11 having a main magnet 12 for generating a strong and, in particular, temporally constant main magnet field 13. In addition, the magnetic resonance apparatus 10 includes a patient receiving area 14 for receiving a patient 15. The patient receiving area 14 in the present exemplary embodiment is cylindrical in design and is surrounded in a circumferential direction by the magnet unit 11 in a cylindrical shape. In principle, however, an embodiment of the patient receiving area 14 deviating therefrom is conceivable at any time. The patient 15 may be pushed into the patient receiving area 14 by a patient positioning apparatus 16 of the magnetic resonance apparatus 10. The patient positioning apparatus 16 has a patient table 17 for this purpose which is designed to be movable inside the patient receiving area 14.

The magnet unit 11 also has a gradient coil unit 18 for generating magnetic field gradients that are used for spatial encoding during imaging. The gradient coil unit 18 is controlled by a gradient control unit 19 of the magnetic resonance apparatus 10.

The magnet unit 11 further includes a radio-frequency antenna unit 20, which in the present exemplary embodiment is designed as a body coil permanently integrated into the magnetic resonance apparatus 10. The radio-frequency antenna unit 20 is controlled by a radio-frequency antenna control unit 21 of the magnetic resonance apparatus 10 and radiates radio-frequency magnetic resonance sequences, (e.g., a TSE sequence such as a HASTE or a SPACE sequence), into an examination room formed by a patient receiving area 14 of the magnetic resonance apparatus 10. The radio-frequency antenna unit 20 is in particular configured to emit excitation pulses and/or refocusing pulses. As a result, it is possible to excite atomic nuclei in the main magnetic field 13 generated by the main magnet 12. Magnetic resonance signals are generated through relaxation of the excited atomic nuclei. The radio-frequency antenna unit 20 is configured to receive the magnetic resonance signals. For transmitting RF pulses, in particular excitation pulses and/or refocusing pulses, the magnetic resonance apparatus 10 includes in particular a radio-frequency amplifier, by which signals from HP pulses may be amplified. The amplified signals may be transmitted to the radio-frequency antenna unit 20.

The magnetic resonance apparatus 10 has a system control unit 22 for controlling the main magnet 12, the gradient control unit 19, and the radio-frequency antenna control unit 21. The system control unit 22 controls the magnetic resonance apparatus 10 centrally, for example, the performance of a predetermined magnetic resonance imaging sequence. The system control unit 22 may be configured to carry out a computer-implemented method for ascertaining flip angles of a magnetic resonance sequence with variable flip angles. For this purpose, the system control unit 22 includes, for example, a computing unit and/or a memory unit.

In addition, the system control unit 22 includes an evaluation unit (not shown in more detail) for evaluating the magnetic resonance signals which are detected during the magnetic resonance examination. Furthermore, the magnetic resonance apparatus 10 includes a user interface 23 connected to the system control unit 22. Control information such as imaging parameters, as well as reconstructed magnetic resonance images may be displayed on a display unit 24, (e.g., on at least one monitor), of the user interface 23 for a medical operator. Furthermore, the user interface 23 has an input unit 25, by which information and/or parameters may be entered by the medical operator during a measurement process.

Figure 2:
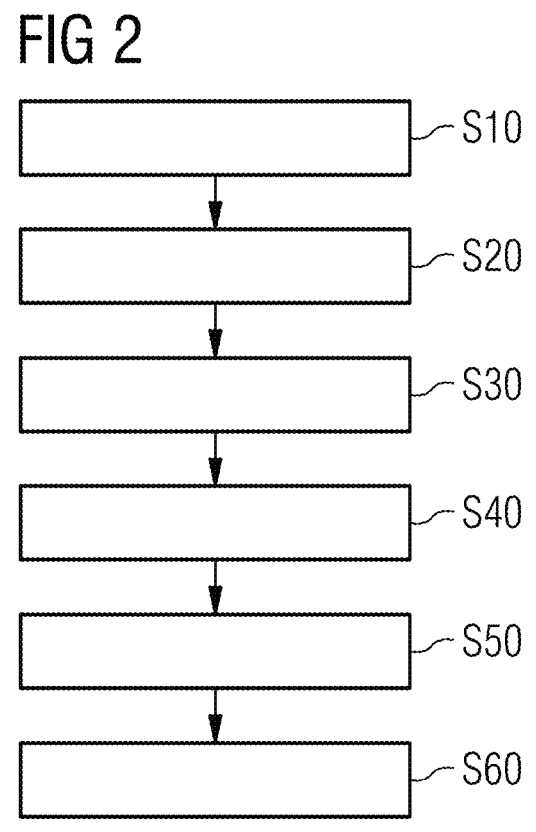

FIG. 2 shows a method for operating the magnetic resonance apparatus 10, in particular for ascertaining flip angles of a magnetic resonance sequence with variable flip angles, wherein the magnetic resonance sequence includes at least one echo train with an excitation pulse and a plurality of refocusing pulses.

In S10, a respective initial flip angle is provided for each refocusing pulse of at least one part of the plurality of refocusing pulses. In S20, a magnitude integral of the excitation pulse is provided. In S30, a magnitude integral of the plurality of refocusing pulses is provided in each case. In S40, an initial reduction factor for reducing the excitation pulse and the plurality of refocusing pulses is provided. S10, S20, S30, and S40 may be carried out simultaneously and/or in any order.

In S50, in each case, an adapted flip angle is ascertained for at least one part of the plurality of refocusing pulses based on the magnitude integral of the excitation pulse, of the respective magnitude integral of the plurality of refocusing pulses, of an initial reduction factor for reducing the excitation pulse and the plurality of refocusing pulses and of the respective initial flip angle for each refocusing pulse of the at least one part of the plurality of refocusing pulses.

In S60, a magnetic resonance measurement is carried out according to a magnetic resonance sequence with the adapted flip angles.

Possible aspects of the method shown in FIG. 2 are described hereinafter.

In the case of magnetic resonance sequences with variable flip angles, (e.g., in a TSE echo train, HASTE echo train, or SPACE echo train), each refocusing pulse may be assigned its own flip angle. This may be used in hyperecho, T2var, T1var, and/or Pdvar technology.

Figure 3:
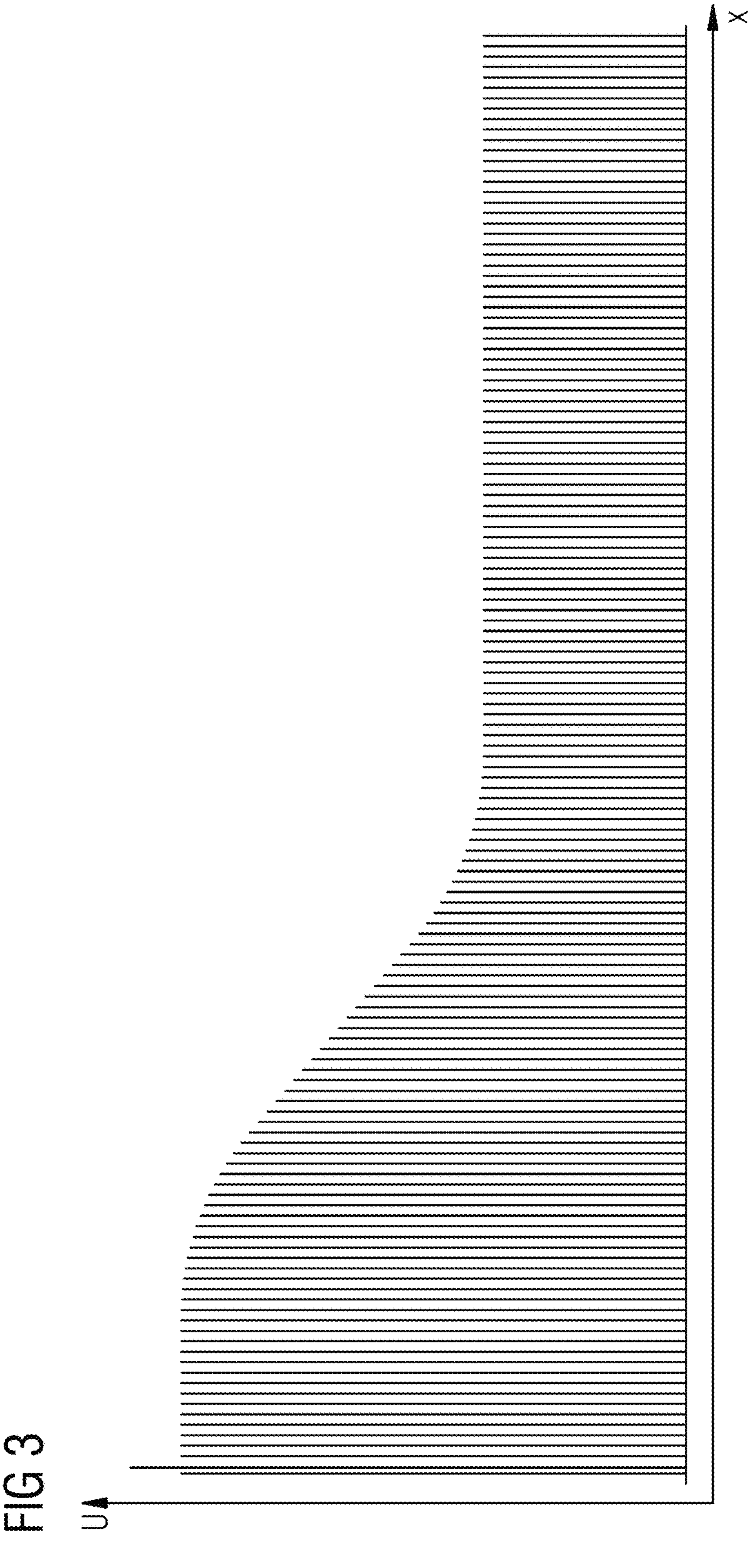
FIG. 3 depicts an example of a flip angle curve.

An example of a flip angle curve of an echo train according to hyperecho technology is shown by way of example in FIG. 3.

The voltage of the RF pulses is plotted on the vertical axis. An initial excitation pulse (x=1) is followed by a plurality of refocusing pulses (x=2, 3, . . . , n). With the same pulse length and pulse shape, the maximum voltage of an RF pulse also reflects its flip angle. That is the case for all the refocusing pulses in this example.

The initial 90° excitation pulse with a flip angle $a_1$ is followed by a first refocusing pulse, the flip angle $a_2$ of which is in turn dependent on the start or plateau flip angle a of the hyperecho train according to:

$$a_2 = 90^\circ + a/2$$

This is followed by a plurality of refocusing pulses, starting, for example, with a flip angle of 165° and a downward trend in further sales.

These two RF pulses may not be changed (e.g., initially), as a result of which a reduction in the flip angles should only have an effect on the subsequent RF pulses. The flip angle of the first refocusing pulse $a_2$ may be adapted retrospectively after ascertaining a'.

As a'<a, ultimately the first refocusing pulse will also become smaller.

First, an initial reduction factor c is ascertained, for example, by the system control unit 22. However, this reduction factor c may relate to the entire echo train, including the first two RF pulses that may not be adapted, however.

In a first act, a corrected reduction factor c is determined using the magnitude integral $M_x$ of an RF pulse at the point x in the echo train:

$$c \cdot \sum_{x=1}^{n} M_x = M_1 + M_2 + c' \cdot \sum_{x=3}^{n} M_x$$

$$c' = \frac{c \cdot \sum_{x=1}^{n} M_x - M_1 - M_2}{\sum_{x=3}^{n} M_x}$$

In the case of a restore pulse at the end of the echo train, the flip angle of the last refocusing pulse x=n is also coupled to the previous RF pulse with 90°+a/2. This may be taken into account when calculating c'.

The flip angle curve is now reduced on the basis of c'. This may take place in two ways in particular, referred to hereinafter as constant reduction or area-proportional reduction.

According to constant reduction, all RF pulses x=3 . . . n are reduced by the factor c', e.g.:

$$a'_{x=3 \ldots n} = c' \cdot a_{x=3 \ldots n}$$

In this case, c' represents a constant factor, in particular a global reduction factor, for all initial flip angles $a_x$, x=3 . . . n.

According to area-proportional reduction, in each case an individual reduction factor $c''_x$ is determined individually for each RF pulse x=3 . . . n based on the area of the RF pulse:

$$c''_{x=3 \ldots n} = c' \frac{M_{x=3 \ldots n}}{\langle M \rangle}$$

In this case, <M> is a mean magnitude integral which is calculated, for example, according to:

$$\langle M \rangle = \frac{\sum_{x=3}^{n} M_x}{n-2}$$

Alternatively, other distribution functions may also be used, for example, with a quadratic weighted area:

$$c''_{x=3 \ldots n} = c' \frac{M^2_{x=3 \ldots n}}{\langle M \rangle^2}$$

According to area-proportional reduction, the reduced flip angles then result in:

$$a'_{x=3 \ldots n} = c'' \cdot a_{x=3 \ldots n}$$

Area-proportional reduction is advantageous as the flip angle at the rear end of an echo train is already quite small when using hyperecho and thus reacts more sensitively to further reduction (for example, flow sensitivity) and, in addition, the effect of reduction for larger flip angles is greater due to the larger area.

The flip angles are also adapted in such a way that at least one specified boundary condition is met. For example, such a boundary condition is that CBM limits are not exceeded. A CBM limit may be understood to mean a Limit of a Charge Balance Model (CBM). A CBM may be used in particular to avoid measurement interruptions due to overloading of the radio-frequency amplifier. For example, such a model is used to check whether a performance limit of the radio-frequency amplifier is exceeded at a certain time before a magnetic resonance measurement is carried out on the basis of runtime information of the RF pulses. If there is a conflict between the power required and the power available, it is advantageous to find and implement a solution.

In a further embodiment, a new flip angle curve is calculated with the maximum magnitude integral available in the entire echo train and a desired contrast behavior as boundary conditions by formulation as an optimization problem. For this purpose, for example, an Extended Phase Graph Simulation may be used.

Finally, it is pointed out once again that the methods described in detail above, as well as the magnetic resonance apparatus shown, are only exemplary embodiments that may be modified in a wide variety of ways by a person skilled in the art without departing from the scope of the disclosure. Furthermore, the use of the indefinite article "a" or "an" does not rule out the possibility that the features in question may also be present more than once. Likewise, the term "unit" does not rule out the possibility that the components concerned include a plurality of interacting part components that may also be spatially distributed.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method for ascertaining flip angles of a magnetic resonance sequence with variable flip angles, wherein the magnetic resonance sequence comprises at least one echo train with an excitation pulse and a plurality of refocusing pulses, the method comprising:

ascertaining in each case an adapted flip angle for at least one part of the plurality of refocusing pulses comprising:

providing in each case an initial flip angle for each refocusing pulse of the at least one part of the plurality of refocusing pulses;

providing a magnitude integral of the excitation pulse, wherein the magnitude integral is a temporal integral over an amount of an amplitude of the excitation pulse;

providing a respective magnitude integral of the plurality of refocusing pulses, wherein the respective magnitude integral is a temporal integral over an amount of an amplitude of the respective refocusing pulse; and ascertaining a respective adapted flip angle for at least one part of the plurality of refocusing pulses based on: (1) the magnitude integral of the excitation pulse, (2) the respective magnitude integral of the plurality of refocusing pulses, and (3) the respective initial flip angle for each refocusing pulse of the at least one part of the plurality of refocusing pulses, wherein the respective initial flip angle for the respective refocusing pulse of the at least one part of the plurality of refocusing pulses is adapted such that at least one specified boundary condition is met to provide the respective adapted flip angle, and wherein the at least one specified boundary condition comprises a performance limit of a radio-frequency amplifier of a magnetic resonance apparatus and/or a maximum specific absorption rate of a patient.

2. The method of claim 1, wherein the ascertaining of the respective adapted flip angle further comprises providing an initial reduction factor for reducing the excitation pulse and the plurality of refocusing pulses, wherein the initial reduction factor is based on a power required when applying the magnetic resonance sequence compared to an available power of the magnetic resonance apparatus, and wherein the ascertaining of the respective adapted flip angle for at least one part of the plurality of refocusing pulses is carried out based on: (1) the magnitude integral of the excitation pulse, (2) the respective magnitude integral of the plurality of refocusing pulses, (3) the respective initial flip angle for each refocusing pulse of the at least one part of the plurality of refocusing pulses, and (4) the initial reduction factor.

3. The method of claim 2, wherein the ascertaining of the respective adapted flip angle for at least one part of the plurality of refocusing pulses comprises ascertaining a global reduction factor according to the following formula:

$$c' = \frac{c \cdot \sum_{x=1}^{n} M_x - M_1 - M_2}{\sum_{x=3}^{n} M_x}$$

where c' is the global reduction factor, c is the initial reduction factor, $M_x$ is a magnitude integral of a radio-frequency pulse at point x in an echo train, $M_1$ is the magnitude integral of the excitation pulse, and $M_{2 \ldots n}$ are the respective magnitude integrals of the refocusing pulses, and wherein the global reduction factor is applied to each refocusing pulse of the at least one part of the plurality of refocusing pulses.

4. The method of claim 2, wherein the ascertaining of the respective adapted flip angle for at least one part of the plurality of refocusing pulses comprises ascertaining an individual reduction factor for each refocusing pulse of the at least one part of the plurality of refocusing pulses, wherein a respective individual reduction factor is ascertained by multiplying a global reduction factor by a weighting of the magnitude integral of the respective refocusing pulse, and wherein the global reduction factor is ascertained according to the following formula:

$$c' = \frac{c \cdot \sum_{x=1}^{n} M_x - M_1 - M_2}{\sum_{x=3}^{n} M_x}$$

where c' is the global reduction factor, c is the initial reduction factor, $M_x$ is a magnitude integral of a radio-frequency pulse at point x in an echo train, $M_1$ is the magnitude integral of the excitation pulse, and $M_{2 \ldots n}$ are the respective magnitude integrals of the refocusing pulses.

5. The method of claim 4, wherein the weighting of the magnitude integral is a linear weighting having the formula $M_{3 \ldots n}/\langle M \rangle$, where $\langle M \rangle$ is a mean value of the amplitude integrals $M_{3 \ldots n}$.

6. The method of claim 4, wherein the weighting of the magnitude integral is a quadratic weighting having a formula:

$$\frac{M_{3 \ldots n}^2}{\langle M \rangle^2}$$

where $\langle M \rangle$ is a mean value of the amplitude integrals $M_{3 \ldots n}$.

7. The method of claim 2, wherein the ascertaining of the respective adapted flip angle for at least one part of the plurality of refocusing pulses is carried out based on a maximum magnitude integral available in an entire echo train.

8. The method of claim 2, further comprising:

ascertaining an adapted flip angle for a refocusing pulse that precedes the at least one part of the plurality of refocusing pulses based on a refocusing pulse of the at least one part of the plurality of refocusing pulses.

9. The method of claim 1, wherein the ascertaining of the respective adapted flip angle for at least one part of the plurality of refocusing pulses comprises ascertaining a global reduction factor according to the following formula:

$$c' = \frac{c \cdot \sum_{x=1}^{n} M_x - M_1 - M_2}{\sum_{x=3}^{n} M_x}$$

wherein c' is the global reduction factor, c is an initial reduction factor, $M_x$ is a magnitude integral of a radio-frequency pulse at point x in an echo train, $M_1$ is the magnitude integral of the excitation pulse, and $M_{2 \ldots n}$ are the respective magnitude integrals of the refocusing pulses, and wherein the global reduction factor is applied to each refocusing pulse of the at least one part of the plurality of refocusing pulses.

10. The method of claim 1, wherein the ascertaining of the respective adapted flip angle for at least one part of the plurality of refocusing pulses comprises ascertaining an individual reduction factor for each refocusing pulse of the at least one part of the plurality of refocusing pulses, wherein a respective individual reduction factor is ascertained by multiplying a global reduction factor by a weighting of the magnitude integral of the respective refocusing pulse, and wherein the global reduction factor is ascertained according to the following formula:

$$c' = \frac{c \cdot \sum_{x=1}^{n} M_x - M_1 - M_2}{\sum_{x=3}^{n} M_x}$$

where c' is the global reduction factor, c is an initial reduction factor, $M_x$ is a magnitude integral of a radio-frequency pulse at point x in an echo train, $M_1$ is the magnitude integral of the excitation pulse, and $M_{2 \ldots n}$ are the respective magnitude integrals of the refocusing pulses.

11. The method of claim 10, wherein the weighting of the magnitude integral is a linear weighting having the formula $M_{3 \ldots n}$/<M>, where <M> is a mean value of the amplitude integrals $M_{3 \ldots n}$.

12. The method of claim 10, wherein the weighting of the magnitude integral is a quadratic weighting having a formula:

$$\frac{M_{3 \ldots n}^2}{\langle M \rangle^2}$$

where <M> is a mean value of the amplitude integrals $M_{3 \ldots n}$.

13. The method of claim 1, wherein the ascertaining of the respective adapted flip angle for at least one part of the plurality of refocusing pulses is carried out based on a maximum magnitude integral available in an entire echo train.

14. The method of claim 1, further comprising:

ascertaining an adapted flip angle for a refocusing pulse that precedes the at least one part of the plurality of refocusing pulses based on a refocusing pulse of the at least one part of the plurality of refocusing pulses.

15. The method of claim 1, wherein the magnetic resonance sequence is a Turbo Spin Echo (TSE) sequence.

16. The method of claim 15, wherein the TSE sequence is a Half-Fourier Acquisition Single-shot Turbo spin Echo imaging (HASTE) sequence, or a Sampling Perfection with Application optimized Contrasts using different flip angle Evolution (SPACE) sequence.

17. The method of claim 1, wherein the performance limit of the radio-frequency amplifier comprises an electrical recharging capability.

18. The method of claim 1, wherein the performance limit of the radio-frequency amplifier comprises a maximum electrical charging capacity.

19. The method of claim 1, further comprising:

carrying out a magnetic resonance measurement using the magnetic resonance sequence comprising the adapted flip angles.

20. A magnetic resonance apparatus comprising:

a control unit configured to:

receive a magnetic resonance sequence having variable flip angles, wherein the magnetic resonance sequence comprises at least one echo train with an excitation pulse and a plurality of refocusing pulses; and ascertain in each case an adapted flip angle for at least one part of the plurality of refocusing pulses comprising:

providing in each case an initial flip angle for each refocusing pulse of the at least one part of the plurality of refocusing pulses;

providing a magnitude integral of the excitation pulse, wherein the magnitude integral is a temporal integral over an amount of an amplitude of the excitation pulse;

providing a respective magnitude integral of the plurality of refocusing pulses, wherein the respective magnitude integral is a temporal integral over an amount of an amplitude of the respective refocusing pulse; and ascertaining a respective adapted flip angle for at least one part of the plurality of refocusing pulses based on: (1) the magnitude integral of the excitation pulse, (2) the respective magnitude integral of the plurality of refocusing pulses, and (3) the respective initial flip angle for each refocusing pulse of the at least one part of the plurality of refocusing pulses, wherein the respective initial flip angle for the respective refocusing pulse of the at least one part of the plurality of refocusing pulses is adapted such that at least one specified boundary condition is met to provide the respective adapted flip angle, and wherein the at least one specified boundary condition comprises a performance limit of a radio-frequency amplifier of the magnetic resonance apparatus and/or a maximum specific absorption rate of a patient.

* * * * *